United States Patent
Khemka et al.

(10) Patent No.: US 7,276,419 B2
(45) Date of Patent: Oct. 2, 2007

(54) SEMICONDUCTOR DEVICE AND METHOD FOR FORMING THE SAME

(75) Inventors: Vishnu Khemka, Phoenix, AZ (US); John M. Pigott, Phoenix, AZ (US); Ronghua Zhu, Chandler, AZ (US); Amitava Bose, Tempe, AZ (US); Randall C. Gray, Tempe, AZ (US); Jeffrey J. Braun, Tempe, AZ (US)

(73) Assignee: Freescale Semiconductor, Inc., Austin, TX (US)

(*) Notice: Subject to any disclaimer, the term of this patent is extended or adjusted under 35 U.S.C. 154(b) by 99 days.

(21) Appl. No.: 11/264,068

(22) Filed: Oct. 31, 2005

(65) Prior Publication Data

US 2007/0096225 A1     May 3, 2007

(51) Int. Cl.
    *H01L 21/336*      (2006.01)
(52) U.S. Cl. .................................... 438/305; 438/306
(58) Field of Classification Search ........ 438/305–306, 438/140, 454; 257/335, 341
See application file for complete search history.

(56) References Cited

U.S. PATENT DOCUMENTS 5,387,553 A * 2/1995 Moksvold et al. .......... 438/339
6,927,442 B2 * 8/2005 Kaneko et al. ............. 257/299

* cited by examiner

*Primary Examiner*—Theresa Doan
(74) *Attorney, Agent, or Firm*—Ingrassia Fisher Lorenz (57) ABSTRACT

A semiconductor device may include first, second, and third semiconductor layers. The first and third layers may have a first dopant type, and the second layer may have a second dopant type. A first region within the third semiconductor layer may have the second dopant type. A second region between the first region and the second semiconductor layer may have the first dopant type. A third region above the second region may have the first dopant type. A fourth semiconductor region adjacent to the third region may have a first concentration of the second dopant type. A source contact region may have a second concentration of the second dopant type adjacent to the third semiconductor region and adjacent to the fourth semiconductor region. The second concentration may be higher than the first concentration.

6 Claims, 7 Drawing Sheets

SEMICONDUCTOR DEVICE AND METHOD FOR FORMING THE SAME

FIELD OF THE INVENTION

The present invention generally relates to a semiconductor device and a method for forming a semiconductor device, and more particularly relates to a high power transistor.

BACKGROUND OF THE INVENTION

Integrated circuits are formed on semiconductor substrates, or wafers. The wafers are then sawed into microelectronic dies, or semiconductor chips, with each die carrying a respective integrated circuit. Each semiconductor chip is mounted to a package, or carrier substrate, which is often mounted to a motherboard.

"Power devices" are integrated circuits (IC) that are specifically designed to tolerate the high currents and voltages that are present in power applications, such as motion control, air bag deployment, and automotive fuel injector drivers. In particular applications, the power devices are required to block voltages in both a "positive" direction, where a voltage is applied to the drain side of a particular transistor with the source and the body shorted together and held at ground, and a "negative" direction, in which a negative voltage is applied to the drain side of the transistor with source and body held at ground. The ability to block both positive and negative voltages is known as "bi-directional" voltage blocking.

Traditionally, two separate transistors, placed "back-to-back," are required to achieve bi-directional voltage blocking in power integrated circuit technologies. The need for two transistors drastically increases the size of the die and the final device. Bi-directional blocking can be achieved with one transistor if the source and body terminals are separated. However, traditional high-voltage and high-power devices, such as reduced surface field (RESURF) structures, for power ICs are designed with high-voltage blocking only on the drain side. As a result, the source side is only capable of lower voltage blocking.

Poor voltage blocking performance on the drain side is further compounded by the high concentration of dopants used in the various regions, and when a high voltage, such as between 5 and 7 volts, is applied to the source side, leakage current between the source and body terminal is dramatically increased due to the enhancement in electric field near the heavily doped junctions falling under the gate. Such current is often referred to as "hot carrier injection" (HCI) current, or "avalanche" current, and can significantly degrade the power device performance.

Accordingly, it is desirable to provide a RESURF structure with an increased breakdown voltage on the source side. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

The present invention will hereinafter be described in conjunction with the following drawings, wherein like numerals denote like elements.

DETAILED DESCRIPTION OF THE INVENTION

The following detailed description is merely exemplary in nature and is not intended to limit the invention or application and uses of the invention. Furthermore, there is no intention to be bound by any expressed or implied theory presented in the preceding technical field, background, brief summary, or the following detailed description. It should also be noted that FIGS. 1-14 are merely illustrative and may not be drawn to scale.

Figure 1:
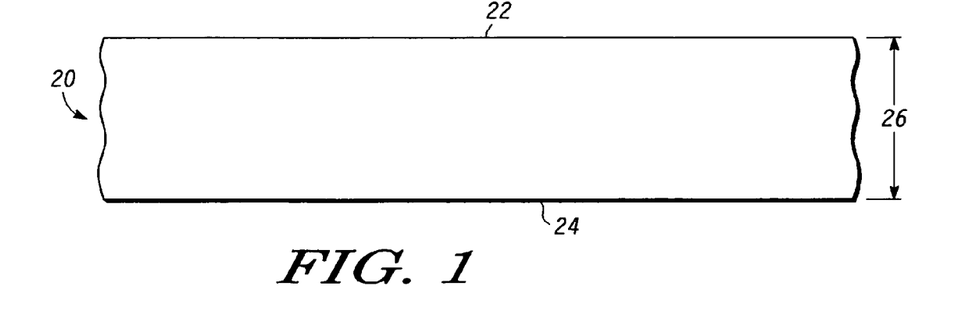
FIG. 1 is a cross-sectional side view of a semiconductor substrate.

FIGS. 1-13 illustrate a method for forming a microelectronic assembly, or a semiconductor device, according to one embodiment of the present invention. Referring to FIG. 1; there is illustrated a semiconductor substrate 20. The semiconductor substrate 20 is made of a semiconductor material, such as gallium arsenide (GaAs), gallium nitride (GaN), or silicon (Si). The substrate 20 has upper surface 22, lower surface 24, and a thickness of, for example, between approximately 300 and 1000 microns. The semiconductor material of the substrate 20 may be of a first conductivity type, or doped with a first dopant type, as is commonly understood in the art. In the example illustrated in FIG. 1, the substrate 20 is a "P-type" semiconductor substrate and is doped with boron (B) to a concentration of approximately $2.0 \times 10^{18}$ atoms per $cm^3$. Although only a portion of the semiconductor substrate is illustrated, it should be understood that the substrate 20 may be a semiconductor wafer with a diameter of, for example, approximately 150, 200, or 300 millimeters. Additionally, although not specifically illustrated, the substrate 20 may be divided into multiplies dies, or "dice," as commonly understood in the art. Furthermore, although the following process steps may be shown as being performed on only a small portion of the substrate 20, it should be understood that each of the steps may be performed on substantially the entire substrate 20, or multiple dice, simultaneously.

Figure 2:
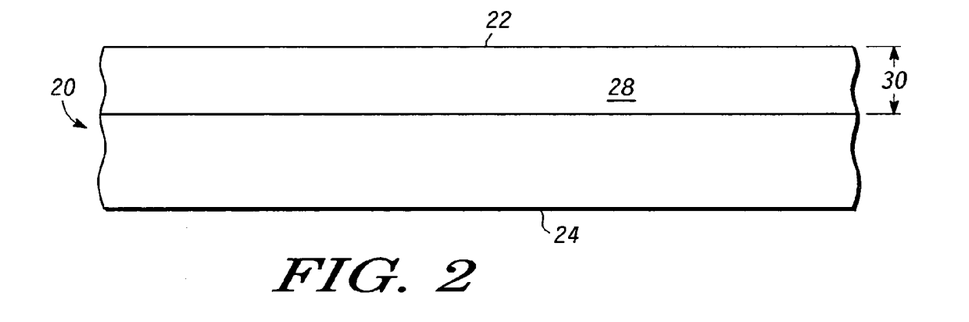
FIG. 2 is a cross-sectional side view of the semiconductor substrate of FIG. 1 with a buried layer formed in an upper surface thereof.

As is illustrated in FIG. 2, a buried layer 28 is first formed in the upper surface 22 of the substrate 20. The buried layer 28 is formed using ion implantation and has a thickness of, for example, between approximately 1 and 2 microns. The ion implantation process changes the semiconductor material of the substrate 20 within the buried layer 28 to have a second conductivity type (i.e., a second dopant type), as is commonly understood. In one embodiment, the buried layer 28 includes "N-type" semiconductor material doped with a relatively high concentration of antimony (Sb) of approximately $1.0 \times 10^{19}$ atoms per $cm^3$.

Figure 3:
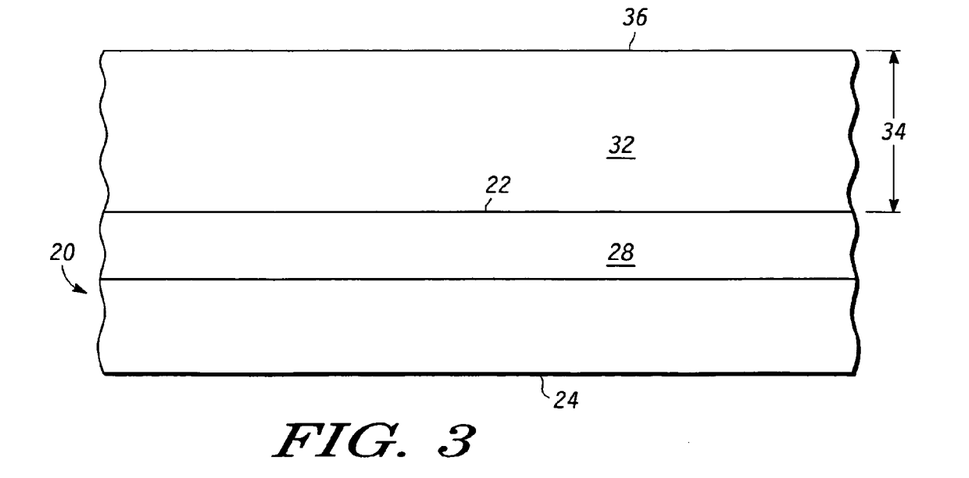
FIG. 3 is a cross-sectional side view of the semiconductor substrate of FIG. 2 with an epitaxial layer formed thereon.

As shown in FIG. 3, an epitaxial layer 32 is then grown on the upper surface 22 of the substrate 20. The epitaxial layer 32 may have a thickness of approximately 2 and 5 microns, and the semiconductor material of the epitaxial layer 32 may have the first conductivity type (i.e., P-type). In one embodiment of the present invention, the epitaxial layer 32 is doped with boron to a concentration approximately $2.0 \times 10^{15}$ atoms per $cm^3$. The epitaxial layer 32 may also have an upper surface 36.

Figure 4:
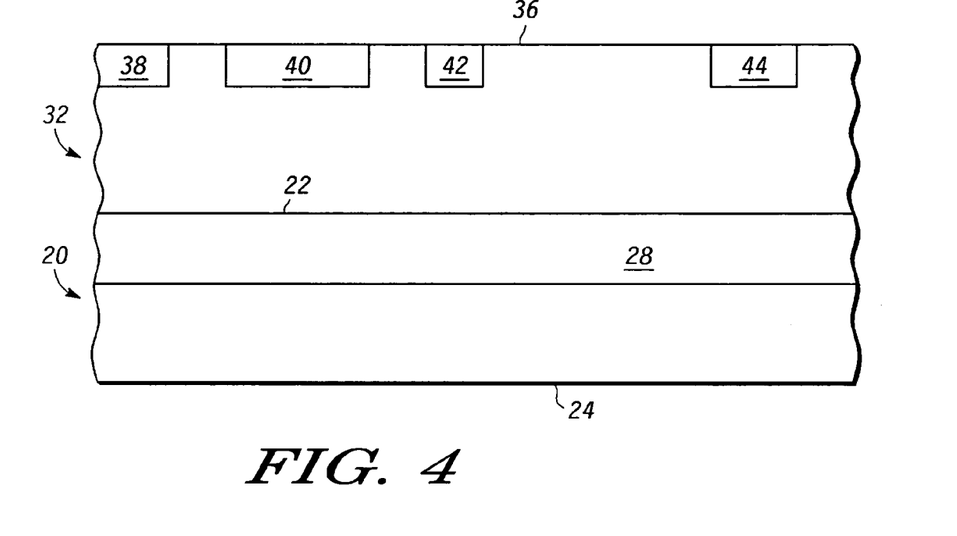
FIG. 4 is a cross-sectional side view of the semiconductor substrate of FIG. 3 with a plurality of isolation regions formed thereon.

Referring to FIG. 4, first, second, third, and fourth shallow trench isolation (STI) regions 38, 40, 42, and 44 are then formed on the upper surface 36 of the epitaxial layer 32. As is commonly understood in the art, the STI regions 38, 40, 42, and 44 may be formed by etching trenches into the upper surface 36 of the epitaxial layer 32 and filling the trenches with an insulating material, such as a field oxide. The STI regions 38, 40, 42, and 44 may have thicknesses of, for example, between 0.3 and 1 micron. The widths of the STI regions may be appropriately adjusted depending on the voltage requirements on the semiconductor device and are typically between 0.5 and 5 microns.

Figure 5:
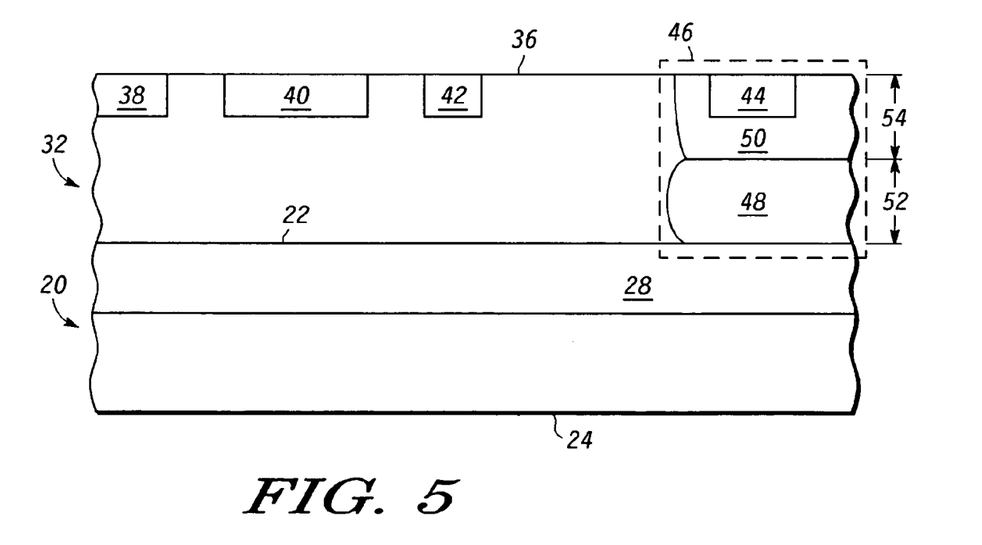
FIG. 5 is a cross-sectional side view of the semiconductor substrate of FIG. 4 with a high voltage well formed in the epitaxial layer.

Next, as shown in FIG. 5, a high voltage well 46 is formed within the epitaxial layer 32 adjacent to and below the fourth STI region 44. In an exemplary embodiment, the high voltage well 46 is formed using ion implantation and includes a P-type region 48 and a N-type drift region 50. The P-type region 48 is adjacent to the buried layer 28 and is doped with, for example, boron with a concentration of approximately $2.0 \times 10^{16}$ atoms per $cm^3$ to have the first conductivity type. The P-type region 48 may have a thickness 52 of approximately 1.5 microns. The N-type drift region 50 may be located directly above the P-type region 48, extend to the upper surface 36 of the epitaxial layer 32, and surround the fourth STI region 44, as illustrated in FIG. 5. The N-type drift region 50 may be doped with, for example, phosphorous (P) to a concentration of approximately $4.0 \times 10^{16}$ atoms per $cm^3$. The N-type drift region 50 may have a thickness 54 of approximately 1.5 microns.

Figure 6:
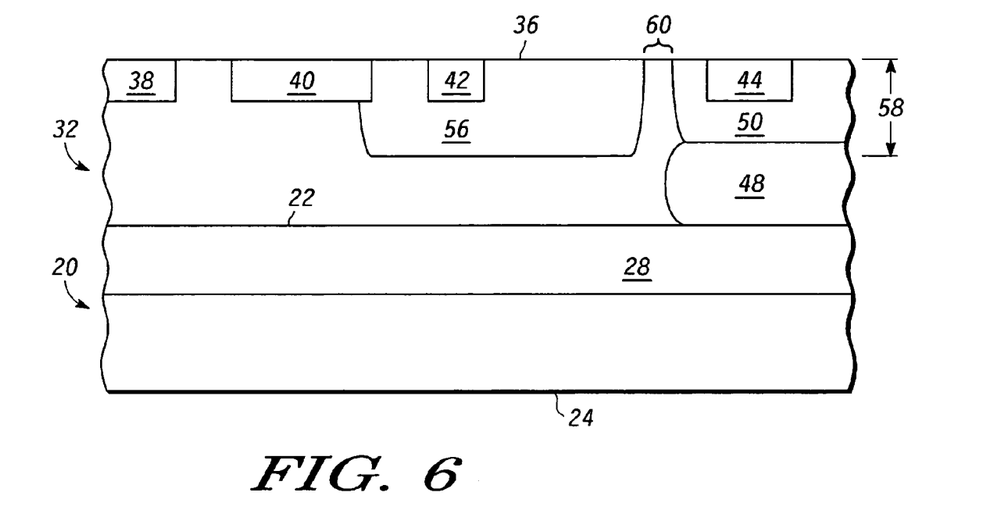
FIG. 6 is a cross-sectional side view of the semiconductor substrate of FIG. 5 with a body region formed in the epitaxial layer.

Referring now to FIG. 6, a body region 56 (e.g., P-body) is next formed in the upper surface 36 of the epitaxial layer 32. The body region 56 may also be formed using ion implantation and have the first conductivity type. The body region 56 may be a P-type region that is doped with boron to a concentration of approximately $2.0 \times 10^{17}$ atoms per $cm^3$. The body region 56 may have a thickness 58 of approximately 1.6 microns, contact one end of the second STI region 40, and surround the third STI region 42. A gap 60 of approximately 0.2 microns may lie between the body region 56 and the N-type drift region 50 across the upper surface 36 of the epitaxial layer 32.

Figure 7:
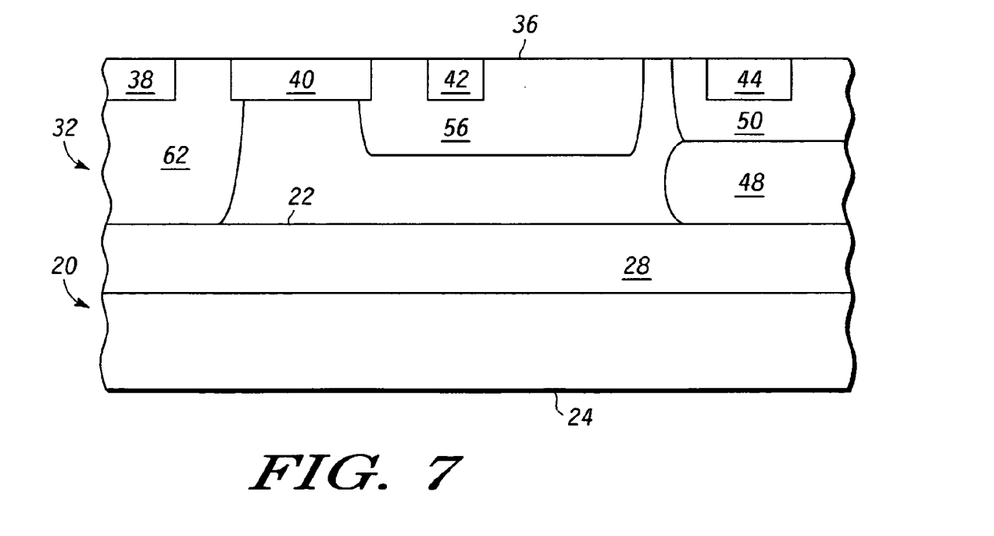
FIG. 7 is a cross-sectional side view of the semiconductor substrate of FIG. 6 with a well region formed in the epitaxial layer.

A "sinker" region 62 is then formed within the epitaxial layer 32 using, for example, ion implantation, as shown in FIG. 7. As is shown, the sinker region 62 extends between the upper surface 36 of the epitaxial layer 32 and the buried layer 28, as well as contacts the first STI region 38 and an end of the second STI region 40. The sinker region 62 is doped to have N-type conductivity (i.e., the second conductivity type and/or dopant type) with phosphorous having a concentration of approximately $5.0 \times 10^{17}$ atoms per $cm^3$.

Figure 8:
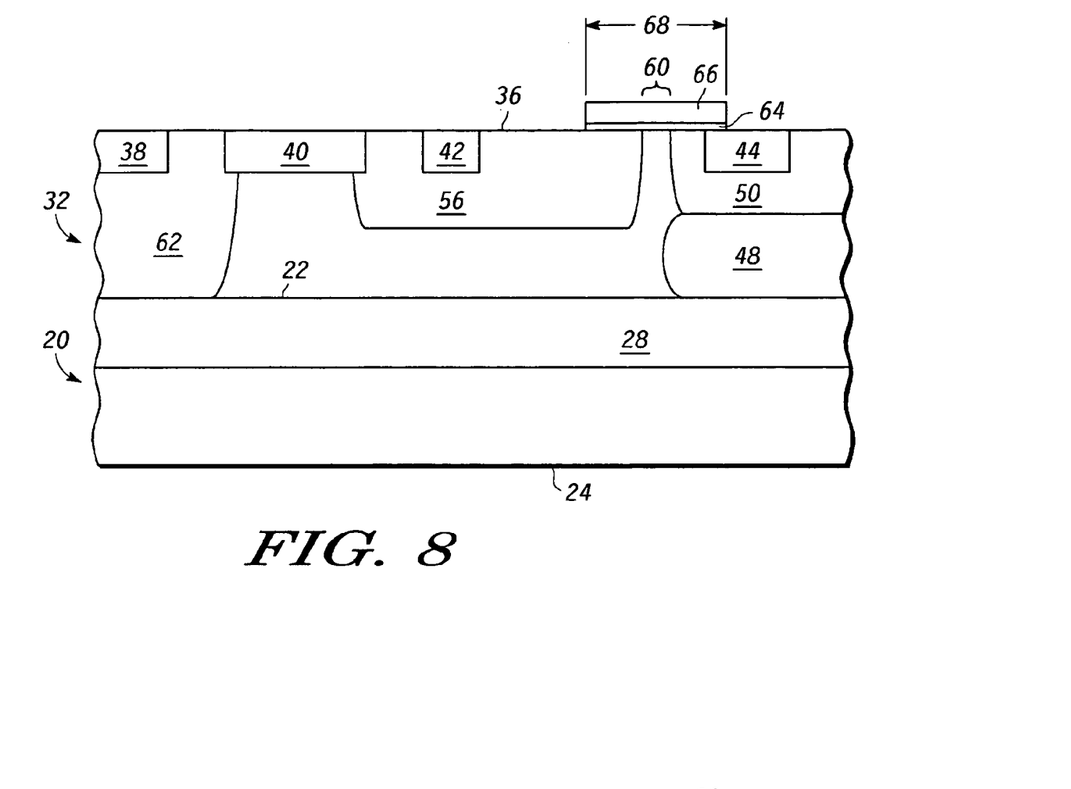
FIG. 8 is a cross-sectional side view of the semiconductor substrate of FIG. 7 with a gate dielectric and gate electrode formed on the upper surface thereof.

Referring to FIG. 8, a gate dielectric 64 and a gate electrode 66 are formed on the upper surface 36 of the epitaxial layer 32. As shown, the gate dielectric 64 and the gate electrode 66 may lie across the gap 60 between the body region 56 and the N-type drift region 50 to partially cover the body region 56, the N-type drift region 50, and the fourth STI region 44. The gate dielectric 64 is made of an insulating material, such as silicon oxide, and has a thickness of, for example, approximately 300 angstroms. The gate electrode 66, in one embodiment, is made of poly-silicon and has a thickness of approximately 0.2 microns. The gate electrode has a gate length 68 of, for example, approximately 2.5 microns.

Figure 9:
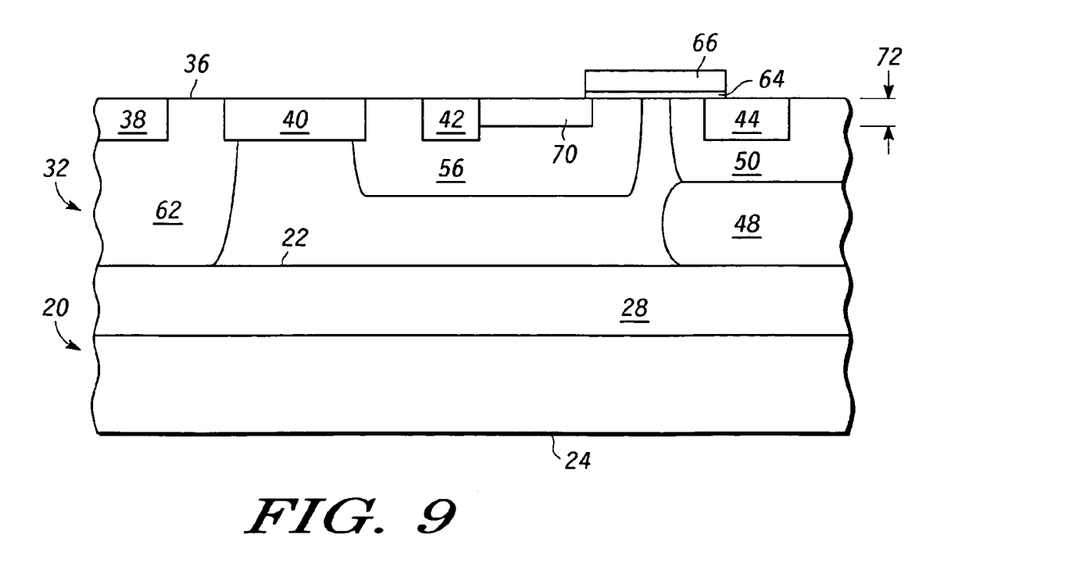
FIG. 9 is a cross-sectional side view of the semiconductor substrate of FIG. 8 with a lightly doped region formed in the well region.

Next, as illustrated in FIG. 9, a lightly doped region 70 is formed within the body region 56. As illustrated, the lightly doped region 70 is located at the surface 36 of the epitaxial layer 32 immediately between and adjacent to the third STI region 42 and the gate dielectric 64. The lightly doped region 70 may have a thickness 72 of, for example, between approximately 0.1 and 1 microns. The lightly doped region 70 may also be formed in the ion implantation and have N-type conductivity, being doped with phosphorous having a concentration of, for example, between $1.0 \times 10^{16}$ atoms per $cm^3$ and $1.0 \times 10^{18}$ atoms per $cm^3$.

Figure 10:
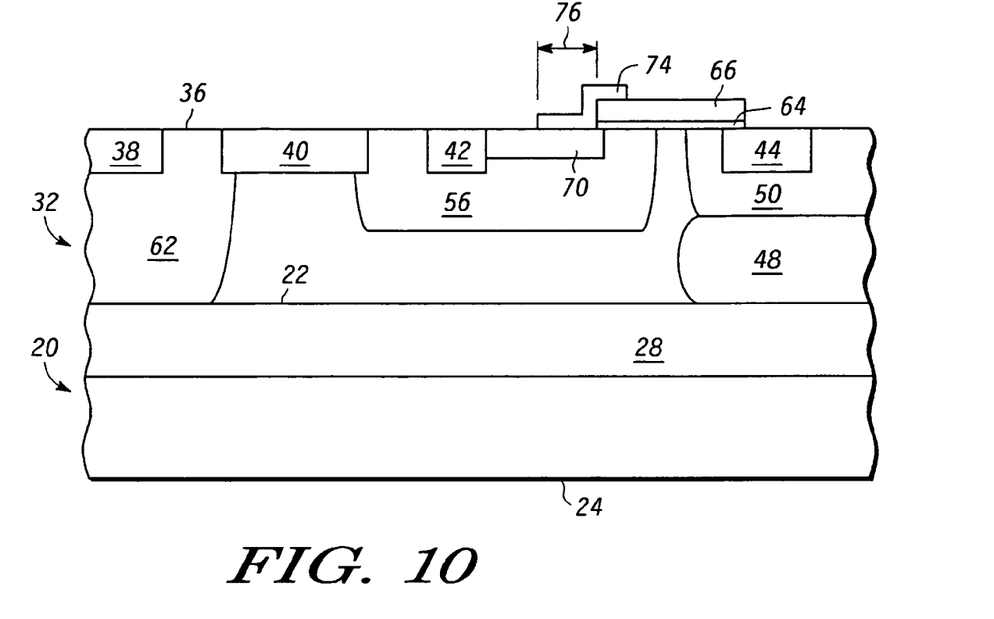
FIG. 10 is a cross-sectional side view of the semiconductor substrate of FIG. 9 with a silicide block layer formed partially over the gate electrode and the lightly doped region.

A silicide block layer 74 is then deposited over a portion of the gate electrode 66 and an adjacent portion of the lightly doped region 70 to a distance 76 away from the gate electrode 66, as illustrated in FIG. 10. The silicide block layer 74 may be made of a dielectric, such as silicon dioxide ($SiO_2$) or silicon nitride (SiN), and have a thickness of approximately 0.1 microns.

Figure 11:
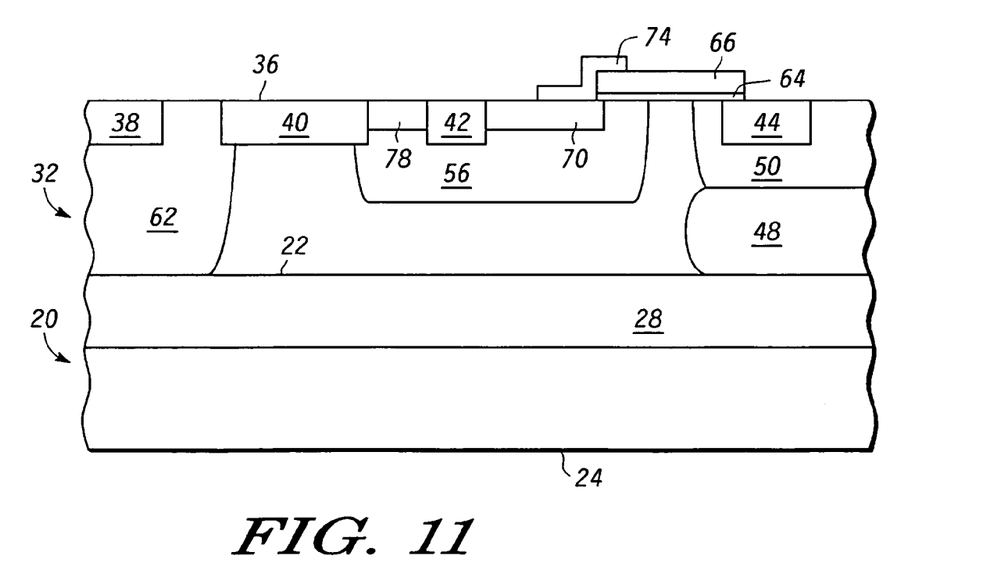
FIG. 11 is a cross-sectional side view of the semiconductor substrate of FIG. 10 with a body contact region formed within the well region.

As shown in FIG. 11, a body contact region 78 is formed in the upper surface 36 of the epitaxial layer 32 adjacent to and between the second STI region 40 and the third STI region 42. The body contact region 78 may be formed using ion implantation and have P-type conductivity. The body contact region 78 may include boron ions with a concentration of $1.0 \times 10^{20}$ atoms per $cm^3$. The body contact region 78 may have thickness similar to that of the lightly doped region 70.

Figure 12:
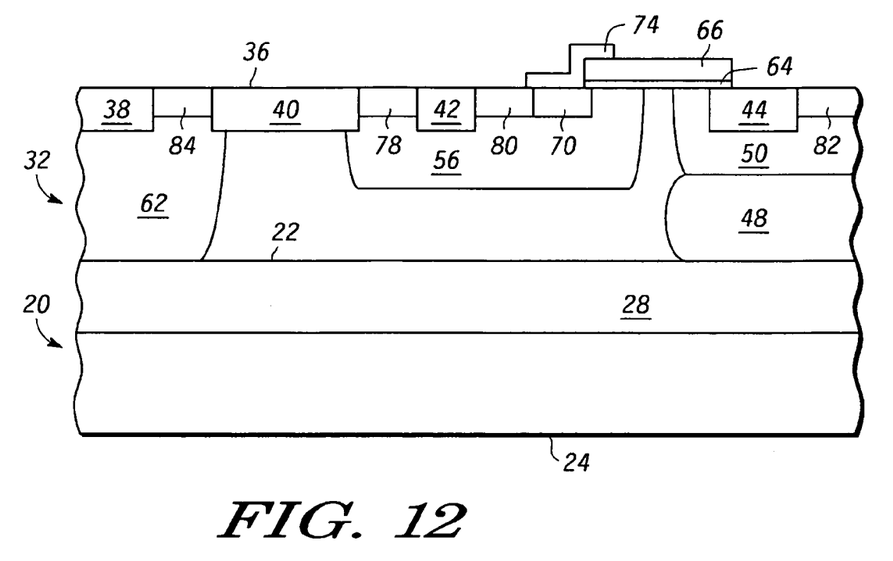
FIG. 12 is a cross-sectional side view of the semiconductor substrate of FIG. 11 with source, drain, and isolation contact regions formed in the upper surface.

Referring now to FIG. 12, a source contact region 80, a drain contact region 82, and an isolation (ISO) contact region 84 are formed in the upper surface 36 of the epitaxial layer 32. The source contact region 80 is formed between the third STI region 42 and the silicide block layer 74 to occupy the portion of the lightly doped region 70 that is not covered by the silicide block layer 74. As a result, the size of the lightly doped region 70 is reduced to only the portion of the original lightly doped region 70 that was covered by the silicide block layer 74 and now acts as a "source separation" region between the gate electrode 66 and the source contact region.

The drain contact region 82 is formed in the N-type drift region 50 adjacent to the fourth STI region 44 on a side thereof opposed to the gate electrode 66. The ISO contact region 84 is formed in the well region 62 adjacent to and between the first STI region 38 and the second STI region 40. Although not specifically illustrated, the ISO contact region 84 may be shorted to the drain contact region and the body contact region via metallization, and the ISO contact region may be electrically floated, as is commonly understood in the art. The formation of the source, drain, and ISO contact regions 80, 82, and 84 may substantially complete the formation of a RESURF structure, as is commonly understood in the art. As will be appreciated by one skilled in the art, the high voltage well 46 and the body region 56 are disposed back to back in a repeating pattern for a large area device, and the sinker region 62 is typically only disposed at the periphery of the device.

The source contact region 80, the drain contact region 82, and the ISO contact region 84 may all have N-type conductivity and include phosphorous ions with a concentration of approximately $1.0 \times 10^{20}$ atoms per $cm^3$. Thus, the source contact region 80 may be doped with the ions of the same conductivity type as the lightly doped region 70 but at a concentration that is at least 100 times greater than the concentration lightly doped in region. In one embodiment, the concentration of the dopant ions in the source contact region 80 is approximately 1000 times greater than that of the lightly doped region 70.

Figure 13:
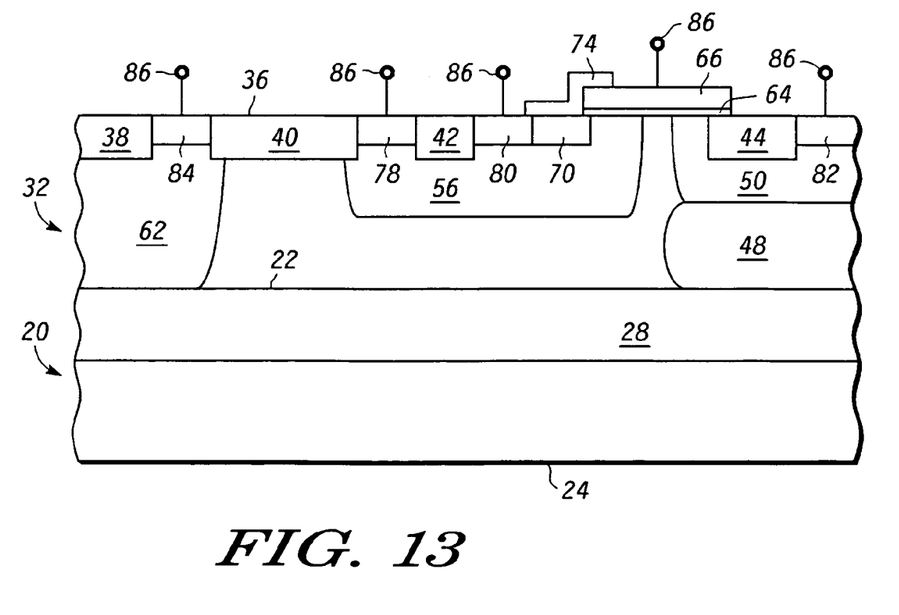
FIG. 13 is a cross-sectional schematic view of the semiconductor substrate of FIG. 12 illustrating electrical connections being made to the various contact regions.

After final processing steps, including the formation of silicide regions over the body contact region 78, the source contact region 80, the drain contact region 82, and the ISO contact region 84, the substrate 20 may be sawed into individual microelectronic dice, or semiconductor chips, packaged, and installed in various electronic or computing systems. As illustrated in FIG. 13, electrical connections 86 are made to the body contact region 17, the source contact region 80, the drain contact region 82, the ISO contact region 84 and the gate electrode 66. During operation, the lightly doped region 70 between the source contact region 80 and the gate electrode 66 increases the breakdown voltage of the device and prevents rapid increase in leakage current due to electric field enhancement.

Figure 14:
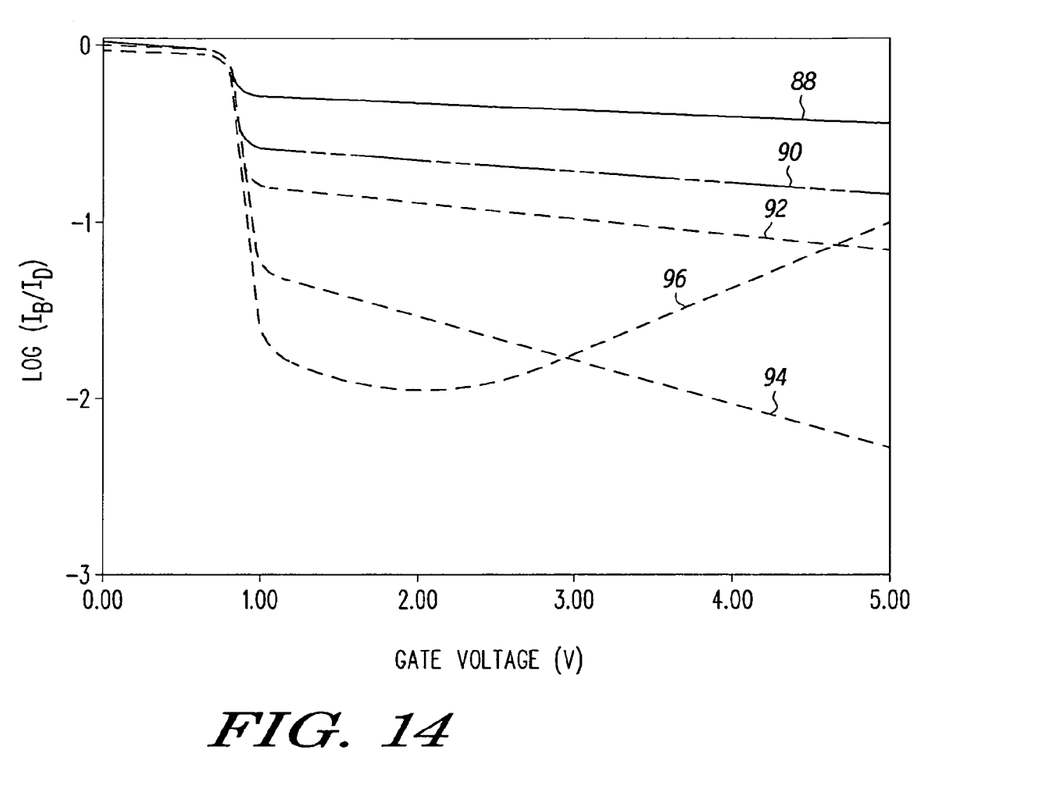
FIG. 14 is a graph illustrating body current to drain current ratios for various gate voltages.

FIG. 14 illustrates simulated ratios of body current ($I_B$) to drain current ($I_D$) at various gate voltages for several different RESURF transistors. A first transistor 88 that was simulated did not have any lightly doped region (similar to region 70) between the source and the gate. A second transistor 90 included a lightly doped region doped to a concentration of $9 \times 10^{12}$ atoms per $cm^2$. A third transistor 92 included a lightly doped region with a concentration of $7 \times 10^{12}$ atoms per $cm^2$. A fourth transistor 94 included a lightly doped region with a concentration of $5.3 \times 10^{12}$ atoms per $cm^2$. A fifth transistor 96 included a lightly doped region with a concentration of $3.5 \times 10^{12}$ atoms per $cm^2$. The second, third, fourth, and fifth transistors 90, 92, 94, and 96 were all doped with phosphorous and included a source doped to a concentration of $1.0 \times 10^{20}$ atoms per $cm^3$.

One advantage of the semiconductor device described above is that because the gate electrode and the source contact region 80 are separated by the lightly doped region 70, the breakdown voltage of the transistor is increased. Therefore, the likelihood that any current will leak through the source side of the transistor when a positive voltage is applied to the source side of the transistor is reduced. Another advantage is that because the RESURF transistor is capable of blocking both positive and negative voltages without the danger of current leaking from the source side of the transistor, a second transistor is not needed to achieve bi-directional voltage blocking. Therefore, the size of the final power device is minimized.

Other embodiments may utilize different dopants at different concentrations. The high voltage well may extend across the epitaxial layer below the body region so that the body region is formed adjacent to, or within, the high voltage well. Although the description above refers to P-type as being the first dopant and conductivity type and N-type as being the second dopant and conductivity type, it should be understood that the dopant types of the various regions may be switched, as is commonly understood in the art. Furthermore, the dopant concentrations described above are merely examples and may be varied.

The invention provides a semiconductor device. The semiconductor device may include a first semiconductor layer having a first dopant type, a second semiconductor layer having a second dopant type over the first semiconductor layer, and a third semiconductor layer over the second semiconductor layer. A first semiconductor region within the third semiconductor layer may have the second dopant type. A second semiconductor region within the third semiconductor layer between the first semiconductor region and the second semiconductor layer may have the first dopant type. A third semiconductor region within the third semiconductor layer above the second semiconductor region may have the first dopant type. A fourth semiconductor region within the third semiconductor layer adjacent to the third semiconductor region may have a first concentration of the second dopant type. A source contact region within the third semiconductor layer adjacent to the third semiconductor region and adjacent to the fourth semiconductor region may have a second concentration of the second dopant type. The second concentration may be higher than the first concentration. The semiconductor device may also include a gate electrode over at least a portion of the first semiconductor region and at least a portion of the third semiconductor region. The gate electrode may be adjacent to and on a side of the fourth semiconductor region opposing the source contact region.

The third semiconductor region may be next to the first semiconductor region and separated from the first semiconductor region by a distance. The third semiconductor region may be disposed inside the first semiconductor region. The second concentration may be at least 100 times greater than the first concentration. The second concentration may be approximately 1000 times greater than the first concentration.

The third semiconductor layer may also include a body contact region having the second dopant type adjacent to the third semiconductor region and a drain contact region having the second dopant type adjacent to the first semiconductor region.

The third semiconductor layer may also include a fifth semiconductor region having the second dopant type adjacent to the second semiconductor layer, and an isolation contact region having the second dopant type adjacent to the fifth semiconductor region. The third semiconductor layer may also include a plurality of trench isolation regions.

The first dopant type may be P-type, and the second dopant type may be N-type. The third semiconductor region may be between the first and fifth semiconductor regions. The semiconductor device may also include a silicide block layer over at least a portion of the fourth semiconductor region and the gate electrode.

The invention also provides a microelectronic assembly. The microelectronic assembly may include a semiconductor substrate having a first layer with a first conductivity type and a second layer with a second conductivity type, an epitaxial layer over the substrate, the epitaxial layer having a first semiconductor region with the second conductivity type, a second semiconductor region with the first conductivity type between the first semiconductor region and the second layer of the semiconductor substrate, a third semiconductor region with the first conductivity type above the second semiconductor region, a fourth semiconductor region with the second conductivity type adjacent to the third semiconductor region, a source contact region with the second conductivity type adjacent to the third semiconductor region and adjacent to the fourth semiconductor region, a body contact region with the first conductivity type adjacent to the third semiconductor region, and a drain contact region with the second conductivity type adjacent to the first semiconductor substrate. The microelectronic assembly may also include a gate electrode over at least a portion of the first semiconductor region and at least a portion of the third semiconductor region of the epitaxial layer. The gate electrode may be adjacent to and on a side of the fourth semiconductor region opposing the source contact region. The fourth semiconductor region and the source contact region may be doped with a dopant of the second conductivity type. The fourth semiconductor region may have a first concentration of the dopant, and the source contact region may have a second concentration of the dopant. The second concentration may be higher than the first concentration.

The second concentration may be at least 100 times greater than the first concentration. The second concentration may be approximately 1000 times greater than the first concentration.

The epitaxial layer may also include a fifth semiconductor region having the second conductivity type adjacent to the second layer of the semiconductor substrate and an isolation contact region having the second conductivity type adjacent to the fifth semiconductor region. The first dopant type may be P-type and the second dopant type may be N-type.

The invention further provides a method for constructing a semiconductor device. The method may include forming a buried layer in a semiconductor substrate having a first dopant type, the buried layer having a second dopant type, forming an epitaxial semiconductor layer over the buried layer, the epitaxial semiconductor layer having the first dopant type, forming a first semiconductor region in the epitaxial semiconductor layer, the first semiconductor region having the second dopant type, a second semiconductor region being defined in the epitaxial semiconductor layer between the first semiconductor region and the buried layer, the second semiconductor region having the first dopant type, forming a third semiconductor region in the epitaxial semiconductor layer, the third semiconductor region having the first dopant type, forming a gate electrode over at least a portion of the first semiconductor region and over at least a portion of the third semiconductor region, forming a fourth semiconductor region in the epitaxial semiconductor layer adjacent to the third semiconductor region and adjacent to the gate electrode, the fourth semiconductor region having a first concentration of the second dopant type, forming a source contact region in the epitaxial semiconductor layer adjacent to the third semiconductor region and adjacent to and on a side of the fourth semiconductor region opposing the gate electrode, the source contact region having a second concentration of the second dopant type, the second concentration being higher than the first concentration, forming a drain contact region in the epitaxial semiconductor layer adjacent to the first semiconductor region, the drain contact region having the second dopant type, and forming a body contact region in the epitaxial semiconductor layer adjacent to the third semiconductor region, the body contact region having the first dopant type.

The method may also include forming a fifth semiconductor region in the epitaxial semiconductor layer adjacent to the second layer of the semiconductor substrate, the fifth semiconductor region having the second dopant type, and forming an isolation contact region in the epitaxial semiconductor layer adjacent to the fifth semiconductor region, the isolation contact region having the second dopant type.

The method may also include forming a plurality of trench isolation regions in the epitaxial semiconductor layer, a first of the trench isolation regions being between the fifth semiconductor region and third semiconductor region, a second of the trench isolation regions being between the body contact region and the source contact region, and a third of the trench isolation regions being between the gate electrode and the drain contact region.

The second concentration may be at least 100 times greater than the first concentration. The method may also include doping the second semiconductor region with the second dopant type. The first dopant type may be P-type and the second dopant type may be N-type.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for constructing a semiconductor device comprising:

forming a buried layer in a semiconductor substrate having a first dopant type, the buried layer having a second dopant type;

forming an epitaxial semiconductor layer over the buried layer, the epitaxial semiconductor layer having the first dopant type;

forming a first semiconductor region in the epitaxial semiconductor layer, the first semiconductor region having the second dopant type, a second semiconductor region being defined in the epitaxial semiconductor layer between the first semiconductor region and the buried layer, the second semiconductor region having the first dopant type;

forming a third semiconductor region in the epitaxial semiconductor layer, the third semiconductor region having the first dopant type;

forming a gate electrode over at least a portion of the first semiconductor region and over at least a portion of the third semiconductor region;

forming a fourth semiconductor region in the epitaxial semiconductor layer adjacent to the third semiconductor region and adjacent to the gate electrode, the fourth semiconductor region having a first concentration of the second dopant type;

forming a source contact region in the epitaxial semiconductor layer adjacent to the third semiconductor region and adjacent to and on a side of the fourth semiconductor region opposing the gate electrode, the source contact region having a second concentration of the second dopant type, the second concentration being higher than the first concentration;

forming a drain contact region in the epitaxial semiconductor layer adjacent to the first semiconductor region, the drain contact region having the second dopant type; and forming a body contact region in the epitaxial semiconductor layer adjacent to the third semiconductor substrate, the body contact region having the first dopant type.

2. The method of claim 1, further comprising:

forming a fifth semiconductor region in the epitaxial semiconductor layer adjacent to the buried layer of the semiconductor substrate, the fifth semiconductor region having the second dopant type; and forming an isolation contact region in the epitaxial semiconductor layer adjacent to the fifth semiconductor region, the isolation contact region having the second dopant type.

3. The method of claim 1, wherein the second concentration is at least 100 times greater than the first concentration.

4. The method of claim 1, further comprising forming a plurality of trench isolation regions in the epitaxial semiconductor layer, a first of the trench isolation regions being between the fifth semiconductor region and third semiconductor region, a second of the trench isolation regions being between the body contact region and the source contact region, and a third of the trench isolation regions being between the gate electrode and the drain contact region.

5. The method of claim 4, further comprising doping the second semiconductor region with the second dopant type.

6. The method of claim 4, wherein the first dopant type is P-type and the second dopant type is N-type.

* * * * *